United States Patent [19]

Soth et al.

[11] Patent Number: 4,887,778

[45] Date of Patent: Dec. 19, 1989

[54] FEEDER DRIVE ASSEMBLY AND REPLACEABLE SECTION FOR TAPE SUPPLYING AND COVER PEELING

[75] Inventors: Henry J. Soth, Brackney, Pa.; Michael D. Snyder, Binghamton, N.Y.

[73] Assignee: Universal Instruments Corporation, Binghamton, N.Y.

[21] Appl. No.: 200,953

[22] Filed: Jun. 1, 1988

[51] Int. Cl.$^4$ ............................................. B65H 20/24
[52] U.S. Cl. .................................. 226/109; 226/111; 226/115; 226/139
[58] Field of Search ................. 226/109, 96, 111, 112, 226/115, 116, 117, 120, 139; 29/740

[56] References Cited

U.S. PATENT DOCUMENTS

| | | | |
|---|---|---|---|
| 4,365,733 | 12/1982 | McNew | 226/109 |
| 4,440,355 | 4/1984 | Mori et al. | 226/120 X |
| 4,606,117 | 8/1986 | Takahashi et al. | 29/740 |
| 4,620,655 | 11/1986 | Fujita | 226/109 |
| 4,735,341 | 4/1988 | Hamilton et al. | 221/1 |

Primary Examiner—Joseph J. Hail, III
Attorney, Agent, or Firm—Fidelman & Wolffe

[57] ABSTRACT

A cassette-like supply and peel assembly of a tape feeder, comprising the support and guide for an electrical component supply tape and the mechanism for peeling a cover from the tape, is removably interconnectable with a drive assembly which provides motive power to the peeler and stepwise feeding of the tape. The length of the feeding steps is adjustable according to the center-to-center distances between components, which can vary from tape to tape. An operator can adjust the step length from the rear of the feeder by varying one limit of a stroking length of the feeder.

8 Claims, 8 Drawing Sheets

FEEDER DRIVE ASSEMBLY AND REPLACEABLE SECTION FOR TAPE SUPPLYING AND COVER PEELING

PRIOR ART CROSS REFERENCES

U.S. Application Ser. No. 861,977 (now U.S. Pat. No. 4,735,341), Hamilton, et al, IMPROVED FEEDER FOR ELECTRICAL COMPONENT SUPPLY TAPES, filed May 12, 1986.

U.S. Pat. No. 4,494,902, Kuppens, et al, METHOD OF AND DEVICE FOR FEEDING ELECTRIC AND/OR ELECTRONIC ELEMENTS TO GIVEN POSITIONS, issued Jan. 22, 1985.

U.S. Pat. No. 4,620,655, Fujita, APPARATUS FOR SUPPLYING TAPED PARTS, issued Nov. 4, 1986.

U.S. Pat. No. 4,606,117, Takahashi, et al, APPARATUS FOR AUTOMATICALLY MOUNTING CHIP TYPE CIRCUIT ELEMENTS ON PRINTED CIRCUIT BOARDS, issued Aug. 19, 1986.

Japanese Patent Disclosure No. 61-64199, laid open Apr. 2, 1986.

BACKGROUND OF THE INVENTION

The invention is in the field of tape feeders in general by which a tape is advanced stepwise to sequentially present components to a pick-up station where the component is removed from the tape for subsequent handling, such as transfer to a conveyor or a circuit board.

Particularly, the invention is directed to feeders for stepwise indexing of tapes having pockets containing surface mountable electrical components. Typically, a top cover of the tape is peeled sufficiently from the substrate so as to open each pocket in turn, and thus provide access to the component therein. Auxiliary covers or movable "shutters" often are provided to prevent loss of components from opened pockets.

Several types of supply tapes are used presently, and the invention is applicable to these and other component supply tapes. One tape has a plastic substrate embossed to define component holding pockets which are enclosed by a separable thin plastic top cover; another tape has holes all the way through a cardboard substrate with top and bottom covers for the holes so as to define the component pockets.

The prior art cross-referenced above generally discloses peeling of the tape cover by indexing a take-up reel along with indexing of the component supply tape, wherein the cover is passed around a fixed guide surface and maintained under tension by the take-up reel. Although the apparatus of the invention is particularly adapted to a peeling mechanism which is different from these cross-references, the concepts of step length adjustment and interchangeable supply and peel assemblies of the invention are equally adaptable to the prior art.

The majority of the prior art tape feeders utilize indexing wheels having pins on the periphery thereof which are engagable in the indexing holes of the supply so as to feed the tape stepwise by rotation of the wheel. Such stepwise rotation is usually accomplished by means of a rack and pawl-type of arrangement wherein the pawl is engaged in a tooth of the rack and moved to advance the rack by one indexing step. Heretofore, the stepping length of indexed feeding by the wheel has been adjustable by removing and relocating a pin which determines whether the pawl engages every rachet tooth or every other rachet tooth. Rather than skipping a rachet tooth to increase the length of feeding step, the prior art has also engaged two consecutive rachet teeth by the pawl, for each step, such that each step actually comprises two half steps.

It is also known to have a belt driven indexing wheel driven by a motor wherein a bit switch of a circuit board is selected to determine a number of revolutions of the motor per indexing step.

In the industry involved, tape feeders are generally "bricked" together side-by-side to provide the maximum amount of feeders in a minimum amount of space and generally it is necessary to remove a feeder in order to change the stepping length and/or the supply tape. If a jam or breakage of the tape occurs with the prior art, it also generally is necessary to remove and replace the entire feeder assembly or to shut it down for an uneconomical length of time necessary to clear the jam or to rethread the tape in the feeder and/or the cover material into the peeler.

The instant invention overcomes these various problems in a unique manner, and these and other advantages and objectives of the instant invention will become apparent from the following detailed disclosure.

SUMMARY OF THE INVENTION

A top cover is peeled from a component supply tape by passing the cover around a guide surface and in a peeling direction generally reverse to the feeding direction of the supply tape while moving the guide surface in the peeling direction in order to minimize the tension necessary to accomplish the peeling.

DETAILED DESCRIPTION OF THE INVENTION

Figures 4, 19:
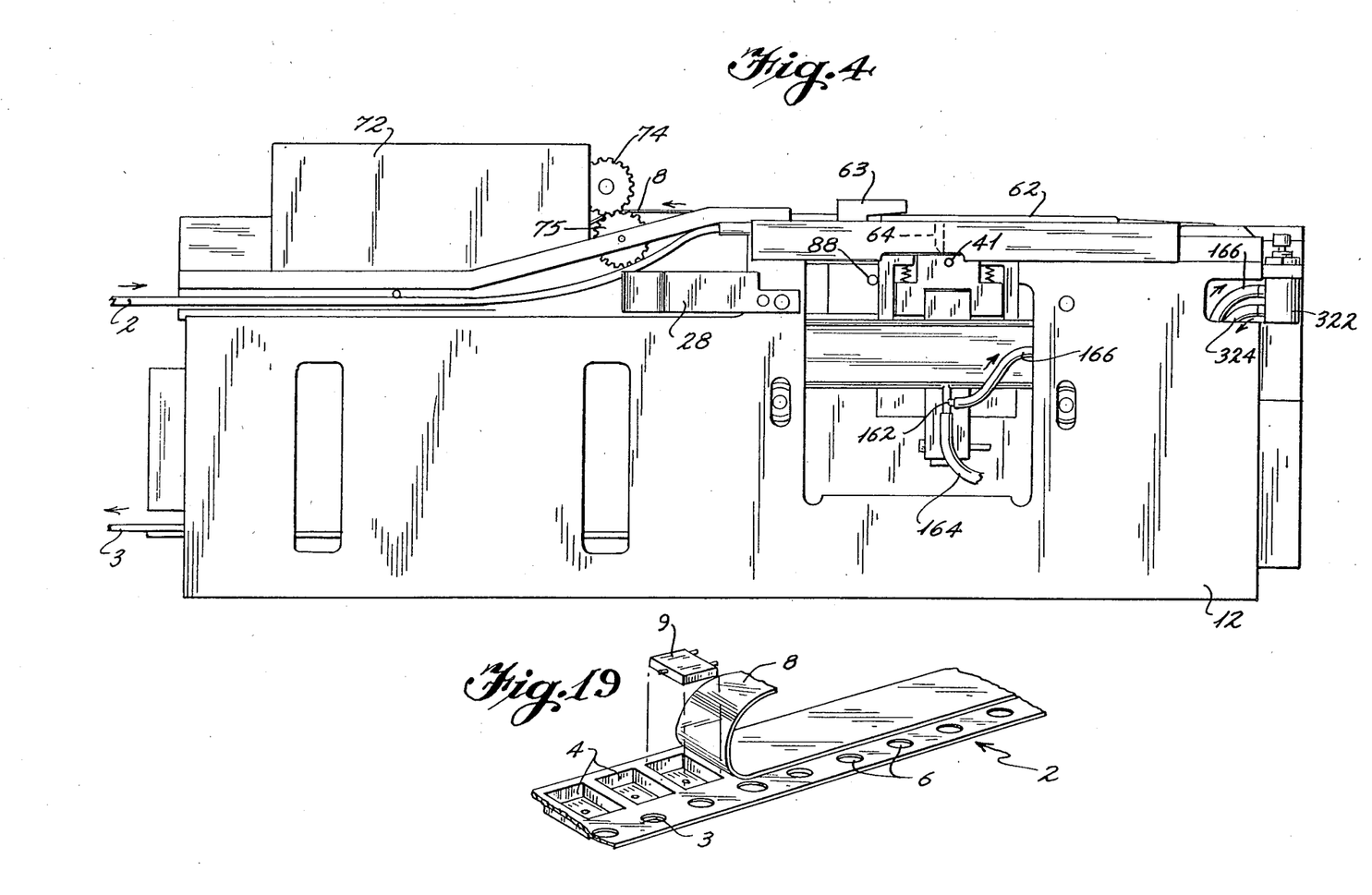
FIG. 4 is a rear elevational view of the device of FIG. 1.
FIG. 19 is a partial isometric view illustrating a component supply tape with pocketed substrate, cover therefor, and component carried thereby.

As seen in FIG. 19, a typical component supply tape 2 comprises a substrate 3 having indexing or feeding holes 6 along an edge thereof and pockets 4 in which surface mountable electrical components 9 are receivable. A cover 8 of "MYLAR" or the like retains the components 9 within the pockets 4.

Figure 1:
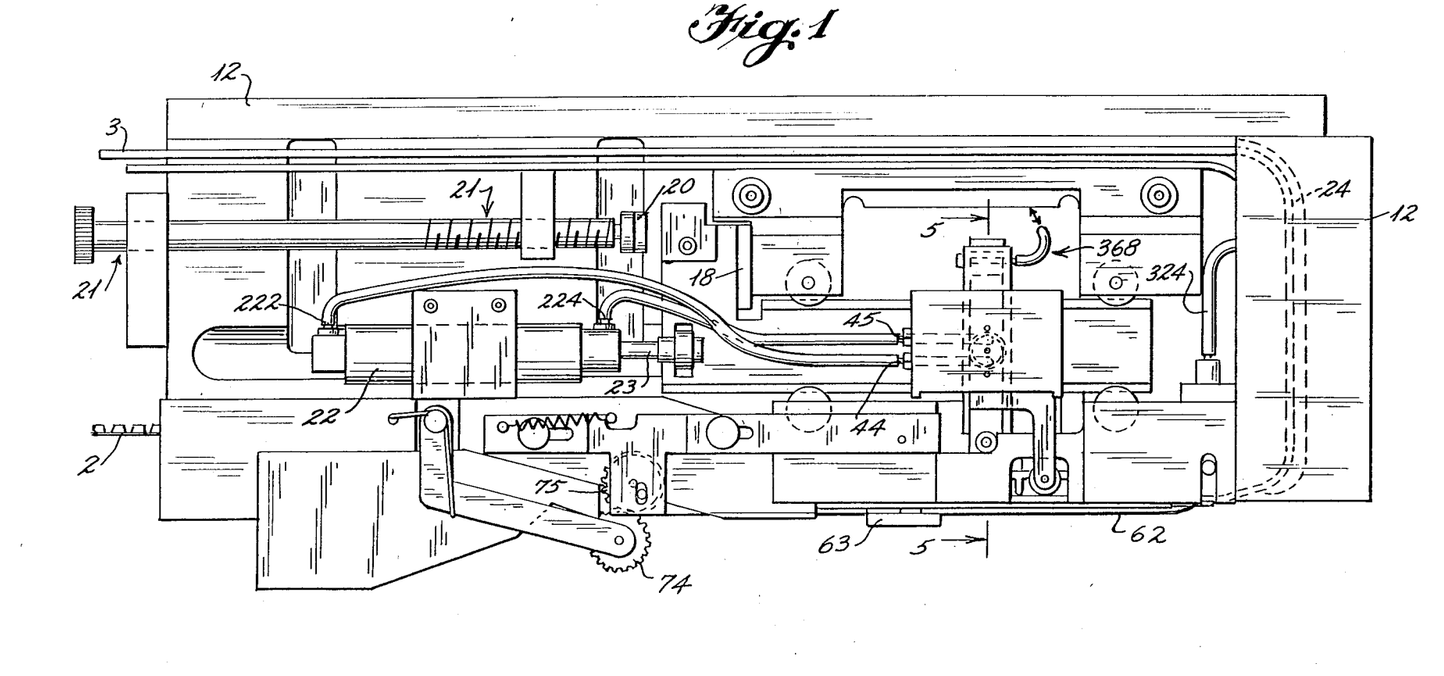
FIG. 1 is a front elevation of an apparatus of the invention.
Figure 2:
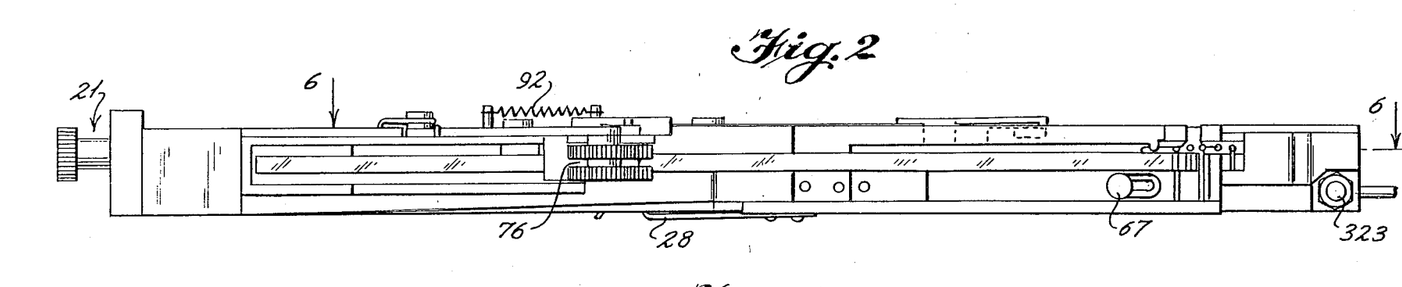
FIG. 2 is a top plan view of the device of FIG. 1.
Figure 5:
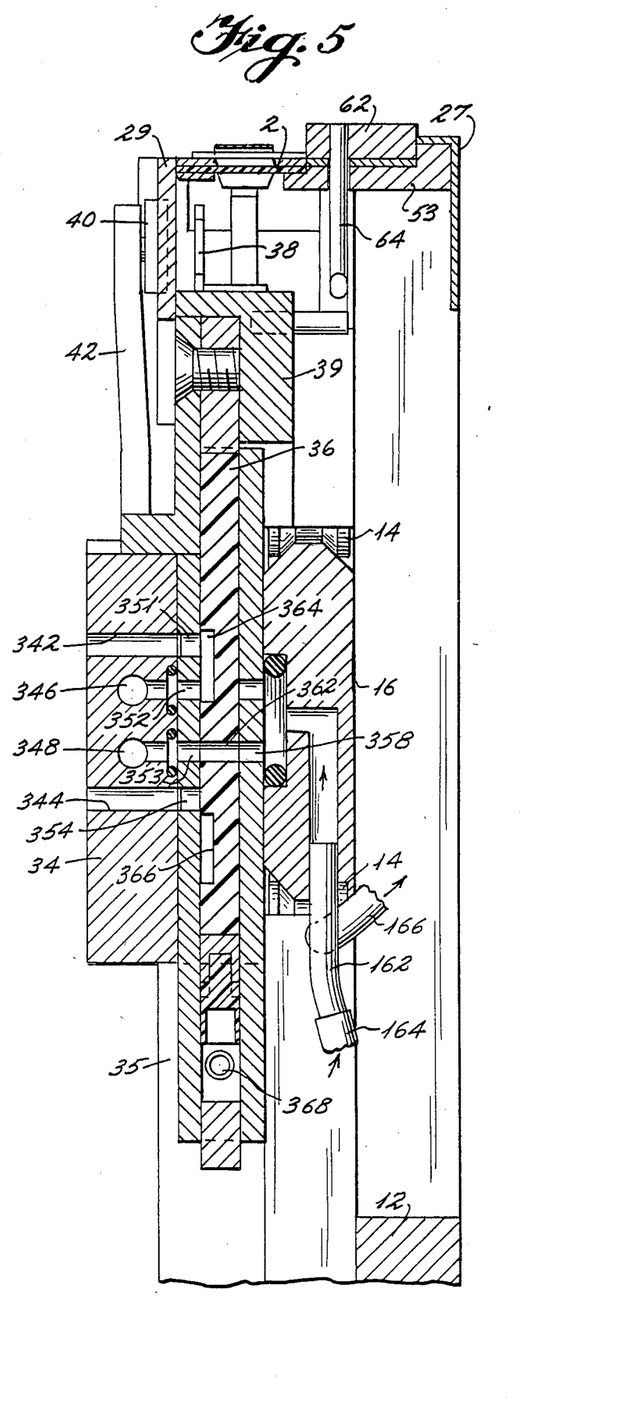
FIG. 5 is a cross section of FIG. 1, as viewed generally in the direction of arrows 5—5.
Figure 6:
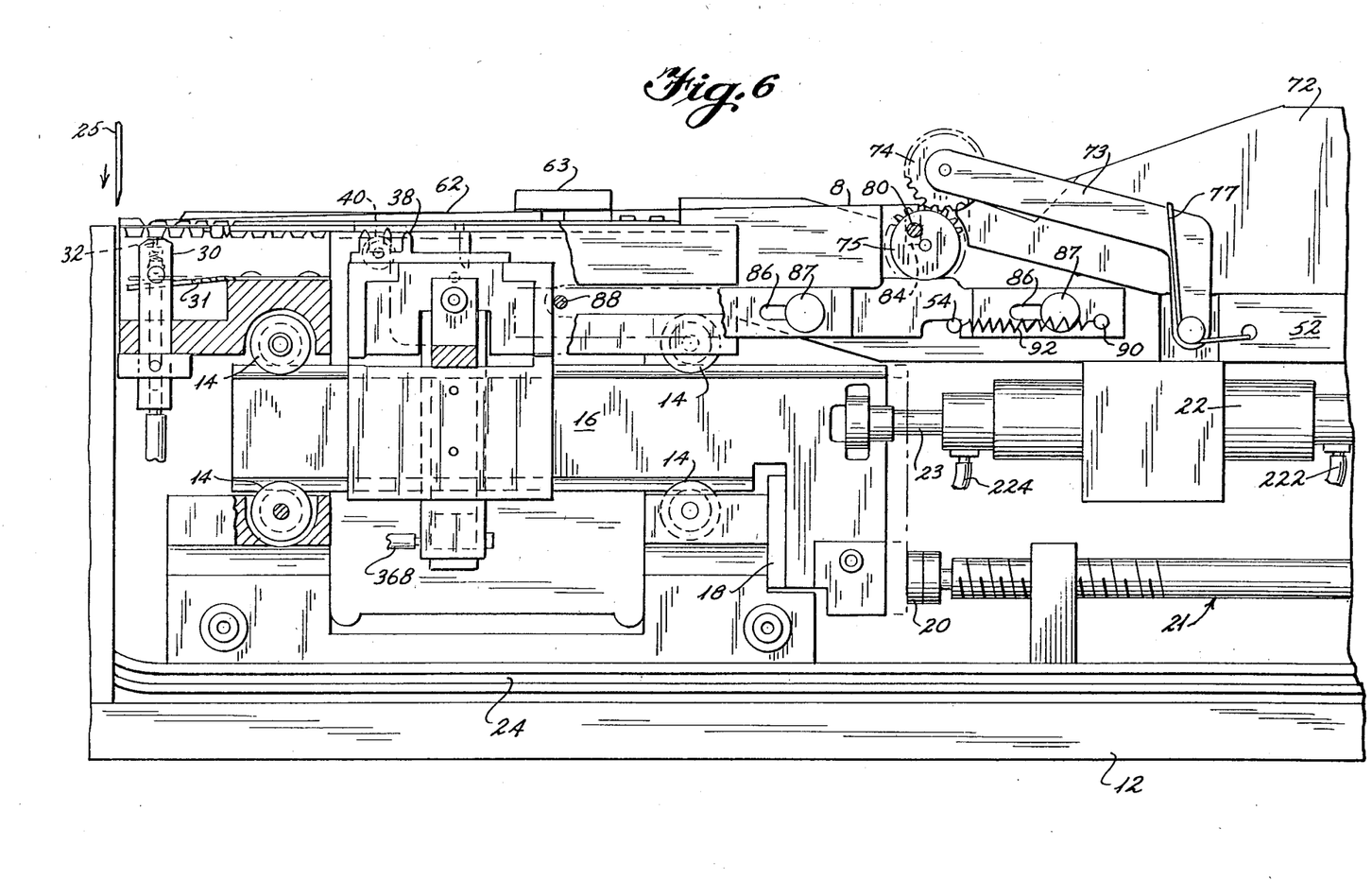
FIG. 6 is an enlargement of a portion of FIG. 1, with portions thereof removed and/or broken away.
Figure 7:
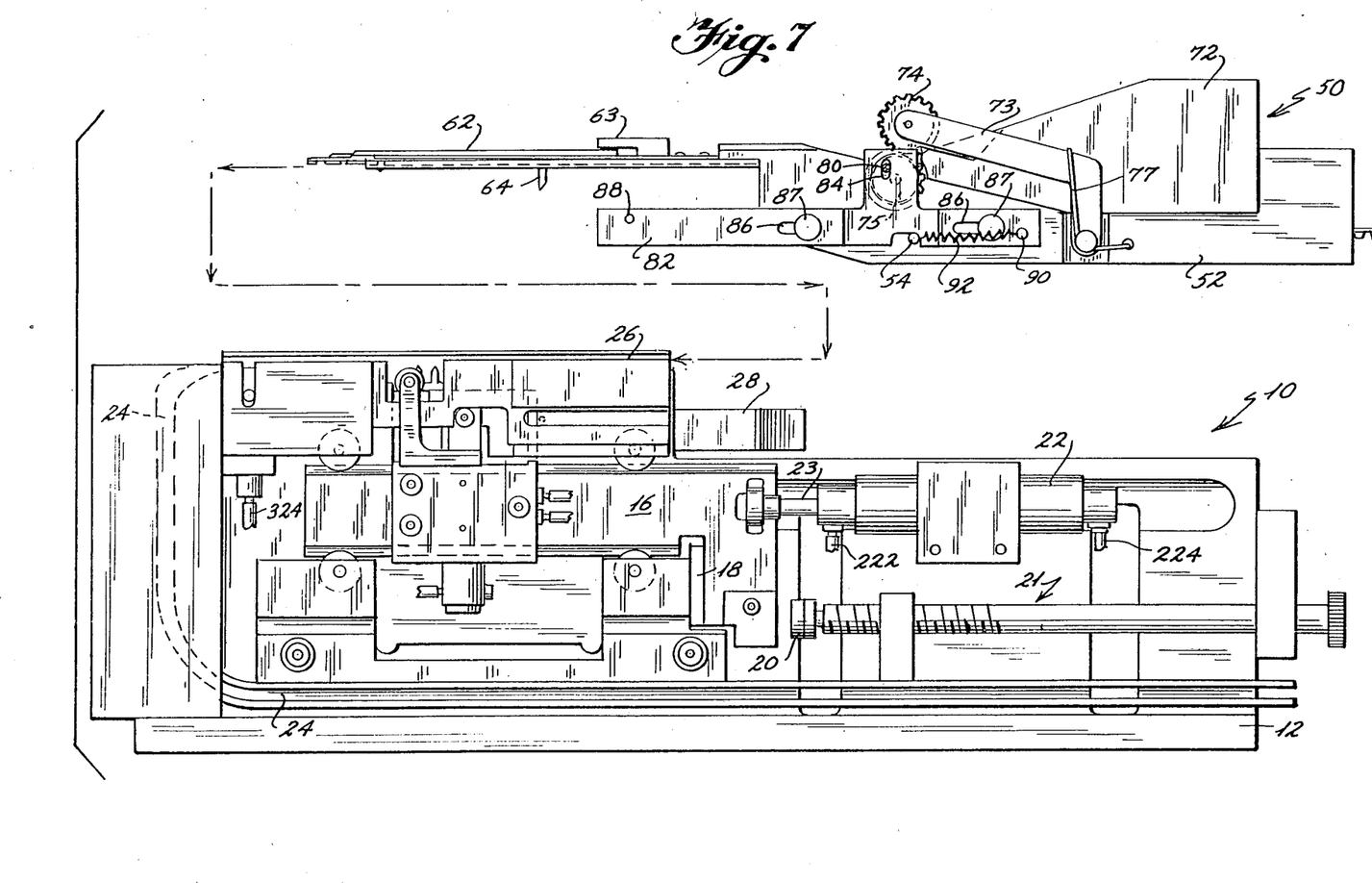
FIG. 7 is a front elevation of the device of FIG. 1, illustrating the separability of the major portions of the device.

Referring to FIGS. 1—7, a loaded supply tape 2 enters the feeder (on the left a viewed in FIG. 4) for incremental feed of each pocket 4 thereof to a pick-up station. The covering material 8 is removed sequentially from each pocket 4 so as to provide access for a vacuum spindle or other means of retrieving each component out of an opened pocket. After being peeled from substrate 3, covering material 8 is stuffed into a scrap box 72 in a manner yet to be described. As seen in FIGS. 1 and 7, the base 12 of the feeder drive assembly 10 has a guide channel 24 through which the empty substrate 3 is redirected from the front or forward end of the feeder (the left end as viewed in FIG. 1) toward the rear of the feeder (the right end as viewed in FIG. 1). A cutter 25 (FIG. 6) may be provided to sever the empty substrate 3 at a point just after the pick-up station so as to facilitate interchanging of supply and peel assemblies 50 with a drive assembly 10, as may be better understood by referring to FIG. 7.

As seen in FIG. 6, a backing member 30 is biased by spring metal member 31 into engagement with the underside of a tape pocket 4 which is situated at the pick-up station in order to ensure good contact of the vacuum spindle with the component 9 during pick-up thereof. Member 30 may also have an ejection pin 32 for penetrating the bottom of a pocket and overcoming static electricity or the like which might hinder retrieval of a component 9 from the pocket 4. Ejector pin 32 is normally biased downwardly by a spring or the like and is extended into a pocket 4 of the substrate 3 by means of fluid pressure through hose 324.

Figure 15:
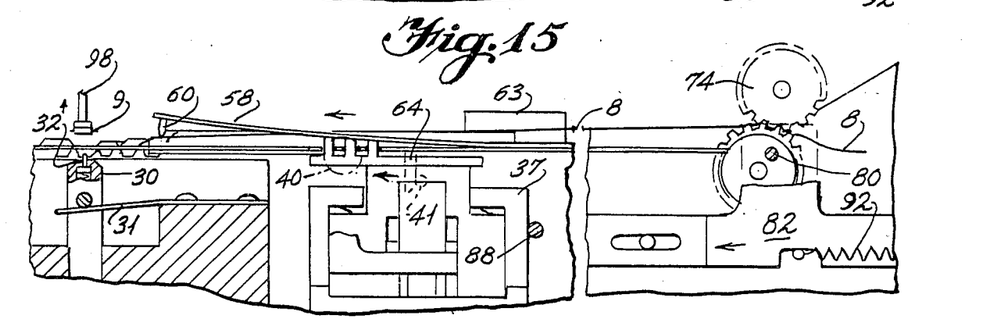

Referring to FIGS. 6, 11 and 14—16, the tape 2 is advanced or fed incrementally by raising feed pins 38 so as to engage them in indexing holes 6 of substrate 3, whereafter feed pins 38 are displaced to the left from the position of FIG. 15 so as to advance the tape to the left. Then, feed pins 38 are withdrawn from the indexing hole of the substrate and moved to the right (as viewed in these Figures) before again being raised into engagement with other indexing holes 6 in preparation for another cycle of indexed feeding. Thus, feed pins 38 are moved back and forth and up and down in a sequence which describes a counterclockwise, square path of travel.

A particular advantage of the apparatus of the invention is that at least sideways the forward and backward movement of the feed pins 38 is provided by pneumatic cylinder 22 so that the stroke or back and forth displacement of feed pins 38 may be controlled by an adjustable stop 20.

The square motion indexing assembly 33, which supports feed pins 38, includes a plate 16 which is slidably supported by wheels 14 (best seen in FIG. 6), with slide support 16 being connected to piston rod 23 of cylinder 22 for movement back and forth according to actuation of cylinder 22. A forward stop 18 ensures the location of a pocket at the pick-up station at the end of forward stroking, and rearward stop 20 is adjustable by a screw 21 or the like to change a limit of the stroking length and provide that drive assembly 10 (as seen in FIG. 7) can accommodate supply and peel assemblies 50 (also seen in FIG. 7) which require indexing steps of different lengths. This is particularly significant since supply and peel assemblies 50 of generally the same structure can handle tapes 2 requiring feeding steps which differ in length from tape to tape. Since the indexing holes 6 are always spaced the same, from tape to tape, it is only necessary to vary the stroke of drive cylinder 2 in order to accommodate different feeding step lengths defined by different center-to-center distances between sequential pockets 4 of a tape 2.

Each interchangeable supply and peel assembly 50 has a tape guide plate 53 (FIGS. 9 and 10) which is slidably receivable in a channel 26 (FIGS. 5 and 7) of the drive assembly 10. The edges of channel 26 are generally defined by members 27 and 29 as seen in FIG. 5 and, upon sliding of guide plate 53 fully into channel 26, a spring metal latch 28 (FIGS. 2 and 7) latches onto the body portion of the supply and peel assembly 50 to hold it in place. Spring metal latch 28 is easily disengaged by hand in order to allow removal of the supply and peel assembly 50 from drive assembly 10.

As seen in FIG. 7, supply and peel assembly 50 comprises a base 52 on which is mounted the container 72 for receiving covering material 8 after it has been peeled from substrate 3. Base 52 supports lower pulling wheels 75 rotatably and a pivotal arm 73 which, in turn, rotatably supports upper pulling wheels 74. Upper pulling wheels 74 are biased into engagement with lower pulling wheels 75 by spring 77 acting on arm 73, and wheels 74 and 75 have intermeshing teeth on their peripheries. A one-way clutch 78 (FIG. 3) is operatively associated with the lower wheels 75 and has an eccentricly located pin 80 which is receivable within slot 84 of peeling drive link 82. Link 82 is slidably attached to base 52 via slots 86 and pins 87 and is biased to the front of the device by tension spring 92 connected at one end to pin 54 of base 52 and at the other end to pin 90 of link 82. The front or forward end of drive link 82 has a pin 88 for a purpose yet to be described.

Figure 3:
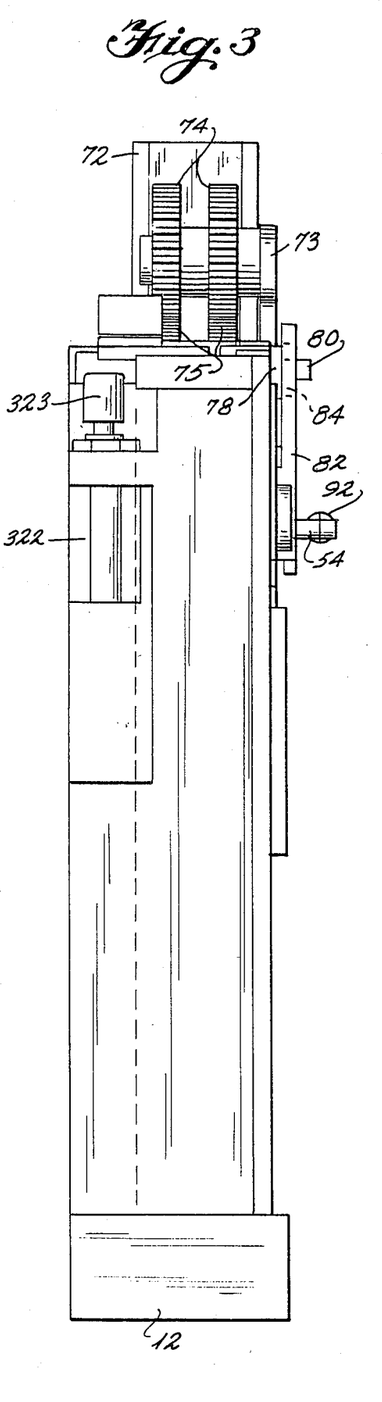
FIG. 3 is a left side elevation of the device of FIG. 1.

As seen in FIG. 3, the upper wheels 74 have a space therebetween into which extends a tape stripper 76 (FIG. 2) to ensure that the covering material 8 being pulled by the wheels does not get wrapped therearound. Lower tape pulling wheels 75 likewise are spaced and provided with a stripper 76.

Figure 8:
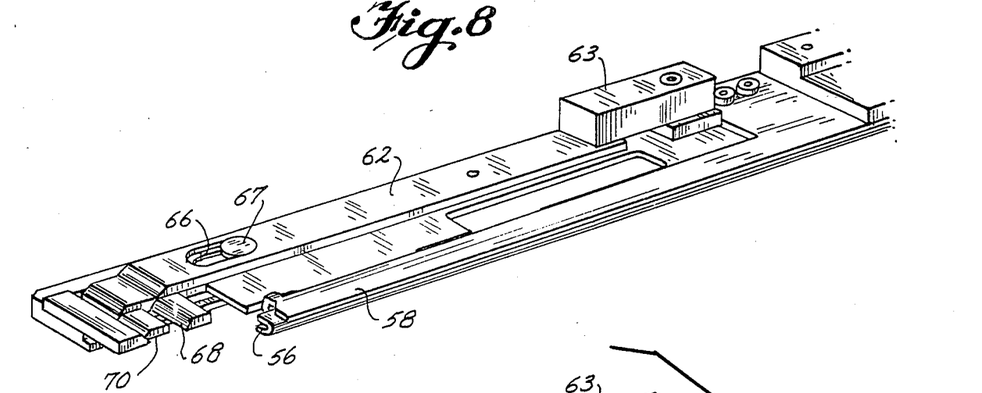
FIG. 8 is an isometric view of the tape guide plate and attached peeler arm.
Figure 9:
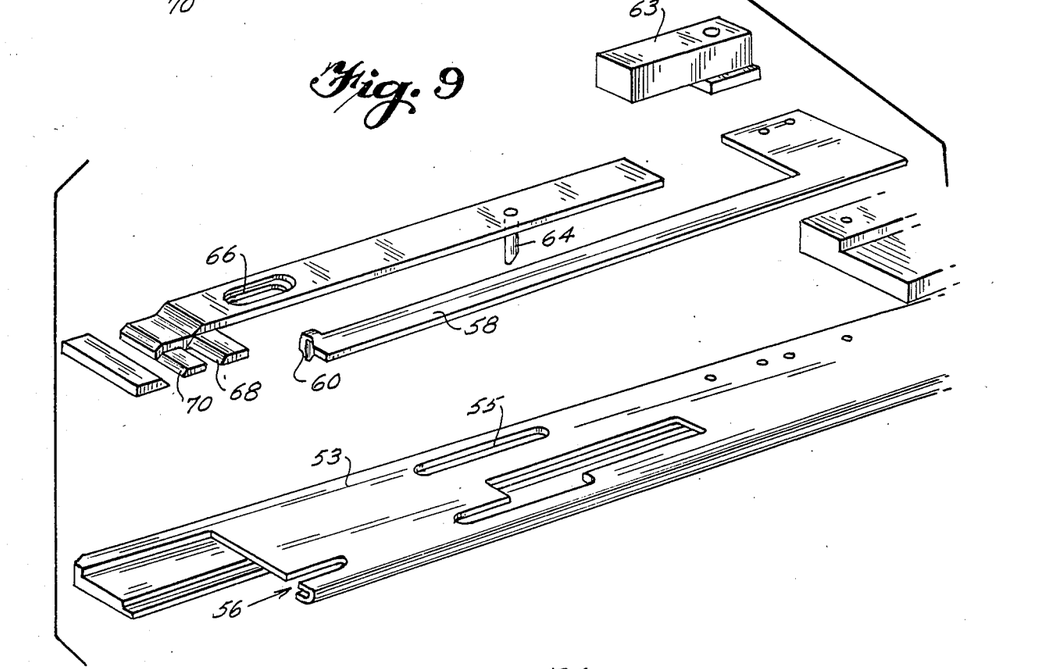
FIG. 9 is an exploded isometric view of the device of FIG. 8.
Figure 10:
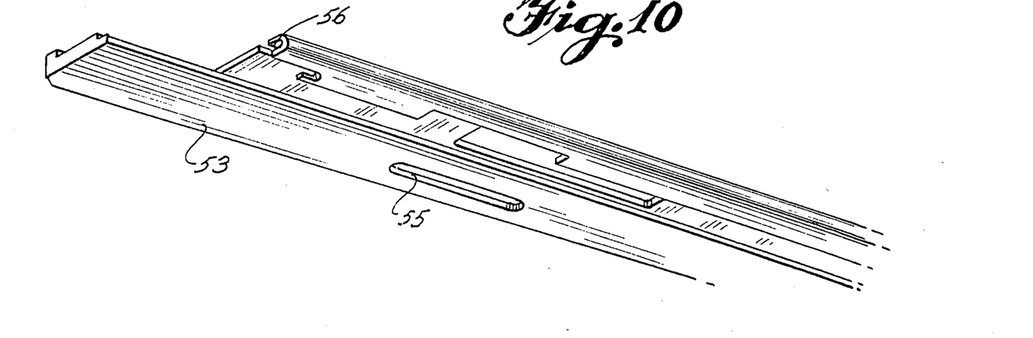
FIG. 10 is an isometric view of the bottom of the tape guide plate.

The front end of base 52 of the supply and peel assembly 50 has the aforementioned tape guide plate 53 affixed thereto, and the reader's attention is directed to FIGS. 8—10 for the structure of tape guide plate 53 and other members attached thereto. Specifically, a spring metal piece 58 is attached to guide plate 53 and has a locator pin 60 depending therefrom which is engagable in an indexing hole 6 of the substrate 3, as will be described later. A peeler arm 62 is slidably attached to guide plate 53 by means of slot 66 and pin 67, and an actuating pin 64 depends from peeler arm 62 through a slot 55 of guide plate 53. The front end of peeler arm 62 supports a laterally projecting guide 68 around which the covering material 8 is guided and reversed in direction when using the feeder. A shutter 70 also projects from peeler arm 62 and is spaced from and slightly forward of cover guiding member 68. A stop assembly 63 provides a rearward limit of sliding to arm 62 and overhangs the rear end thereof.

Further structural details and functioning of the device will become apparent from the following disclosure.

FEEDING AND PEELING

The readers particular attention is directed to FIGS. 12—16 for this description.

After forward indexed feeding of tape 2 by the device, and prior to peeling the cover 8 from substrate 3, shutter 70 is still positioned at a pick-up station (FIG. 12) so as to cover a component 9 which is in a pocket 4 from which the cover material 8 was removed in a previous peeling step. With peeler arm 62 in the position of FIG. 12, covering material 8 is still covering the next pocket after the pocket which is covered by shutter 70.

Figures 12, 13, 14:
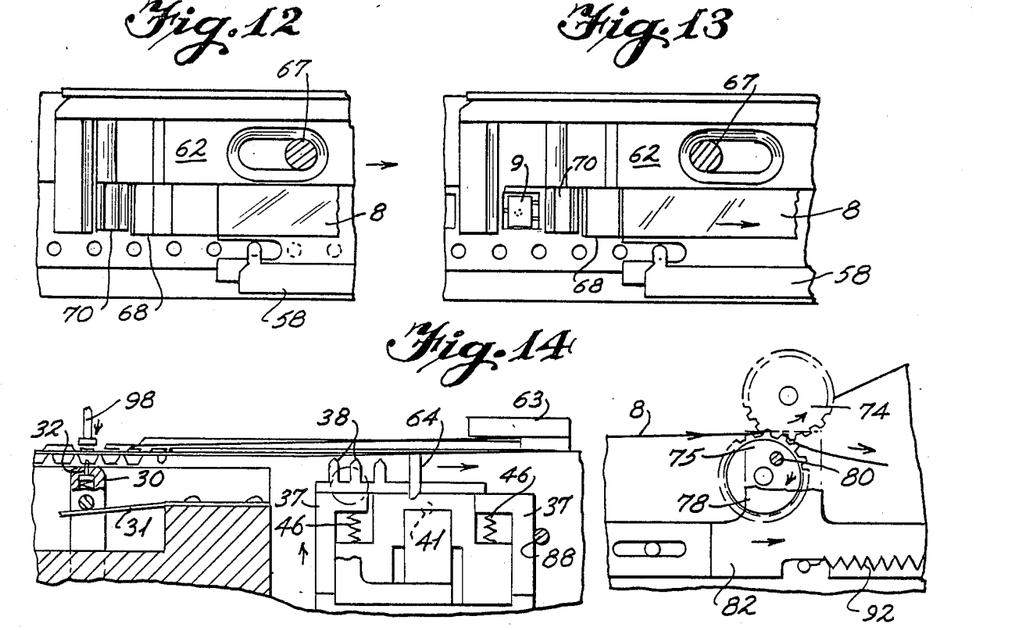
FIGS. 12 and 13 are enlarged, partial top plan elevations illustrating the extreme extended and retracted positions of the peeling guide and shutter.
FIGS. 14—16 are partial front elevations illustrating the tape feeding and cover peeling operations.

Upon peeling the cover material 8 from this next pocket, peeler arm 62 is displaced to the position of FIG. 13 so that shutter 70 uncovers the component 9 situated at the pick-up station for retrieval thereof by a vacuum spindle 98 as seen in FIG. 14. With feed pins 38 disengaged from the indexing holes 6 of the tape and with substrate 3 restrained by locator pin 64 as seen in FIGS. 13 and 14, cover material 8 is pulled to the right and peeled from substrate 3 while causing retraction of peeler guide 68. Retraction of the square motion indexer 33 (to the right in FIG. 14) displaces link 82 against the bias of spring 92 via engagement of one of the arms 37 of the square motion indexing assembly 33 with pin 88 of link 82.

One-way clutch 78 is drivingly engaged with lower wheels 75 only when rotated in the clockwise direction of FIG. 14. Pin 80 of clutch 78 rides in a slot 84 of link 82 so that displacement of link 82 to the right against the bias of spring 92 causes clockwise rotation of clutch 78 which, in turn, rotates lower wheels 75 clockwise. Thus, upper wheels 74 are also rotated, and the intermeshed teeth of wheels 74 and 75 cooperate to pull on the cover material 8 passing between them so as to peel it from the substrate 3. Peeling guide 68, in turn, is pulled by the tension on cover material 8 so as to retract arm 62 to the right, along with shutter 70, to the position of FIG. 14. Covering material 8 passes around guide 68, between it and shutter 70, with shutter 70 being sufficiently close to guide 68 that the shutter recloses a pocket as it is being opened by peeling cover 8 therefrom. Thus, shutter 70 is retracted from the pick-up station at which it is positioned over an already peeled pocket (FIG. 12) to the position of FIG. 13 in which the pocket at the pick-up station is uncovered and the next unpeeled pocket is covered by shutter 70.

With the square motion indexing assembly 33 still retracted to the right in FIG. 14, the feed pins 38 are raised (to the position of FIG. 15) into engagement with the tape indexing holes 6. Simultaneously, the spring metal strip 58 is lifted by roller 40 so as to disengage locator pin 60 from another tape indexing hole in preparation for feeding the tape 2 forward. As seen in FIG. 15, pin 41 of the square motion indexer 33 also is raised so that it will engage pin 64 of peeler arm 62 and drive peeler arm 62 forward in concert with feeding of tape 2, thus maintaining contact between peeler guide 68 and cover material 8 during the indexed feeding of the tape.

Figure 11:
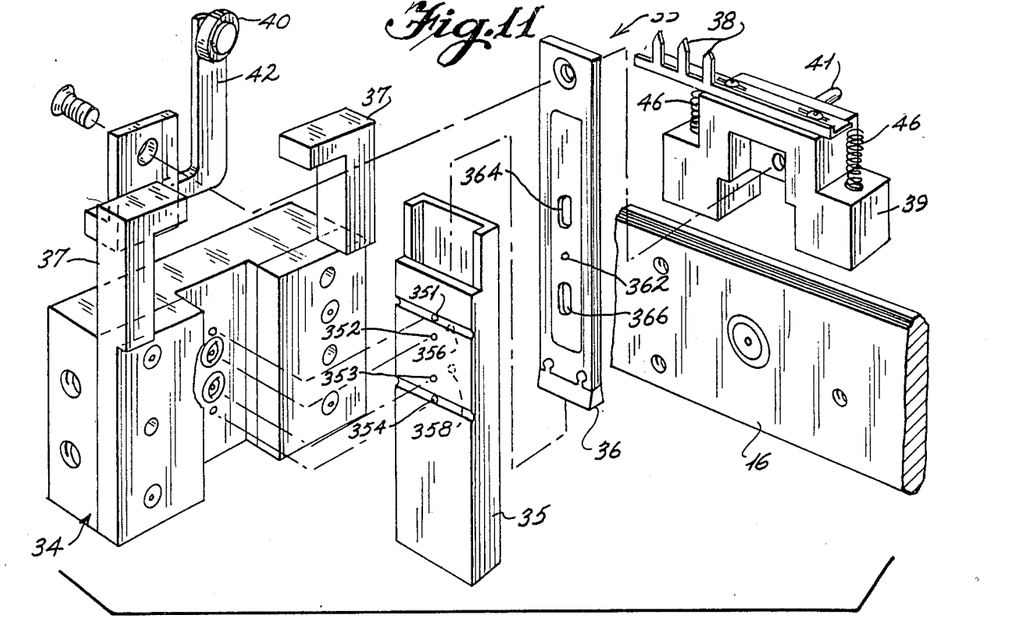
FIG. 11 is an exploded isometric of the square motion indexer assembly.
Figure 16:
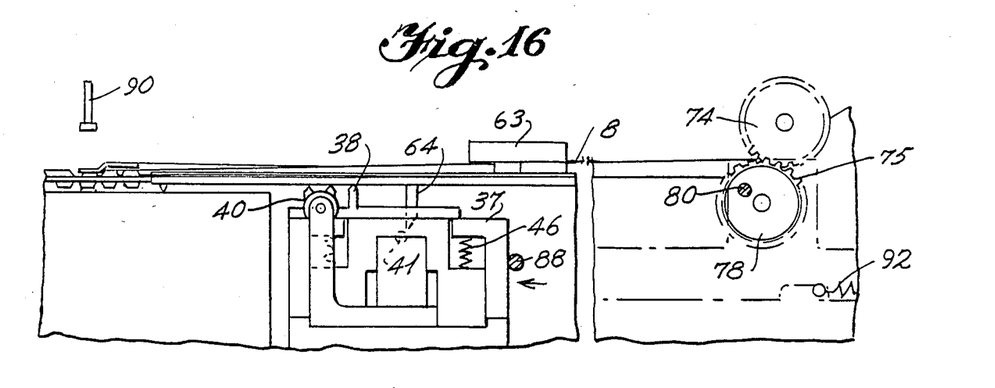

As may be seen in FIG. 11, a piston slide valve 36 has attached thereto an arm 42 for supporting roller 40 and a member 39 for supporting feed fingers 38 and pin 41. Piston 36 is slidably received within cylinder 35 which, in turn, is attached to base 34 and slide plate 16. Base 34 is also provided with inverted L-shaped arms 37 against which springs 46 bear to bias member 39, and thus fingers 38 and pin 41, downwardly as illustrated in FIGS. 14 and 16.

With the feeding pins 38 and pin 41 raised to the position of FIG. 15, fluid is provided to the right end of cylinder 22 in order to extend the piston rod 23 and square motion indexer 33 to the left, with pin 88 of link 82 remaining in engagement with one of arms 37 under the influence of spring 92. During tape feeding, one-way clutch 78 is rotated counterclockwise (to the position of FIG. 16) by way of pin 80 riding in slot 84 of link 82. However, when clutch 78 is rotated in this direction, it is disengaged from peeling wheels 75 so that the peeling wheels 74 and 75 are reversely rotatable by a leftward pull on cover 8 during feeding of tape 2. Thus, peeling tension in cover material 8 is removed during indexed feeding of the tape. In a prototype of the invention, about half of the length of the covering material 8 which was pushed into box 72 during peeling was retracted back out of box 72 during tape feeding in order to relieve tension in the cover material 8 that otherwise would be caused by the feeding step.

After feeding tape 2 by the appropriate amount so as to present the next pocket at the pick-up station, fluid pressure is relieved from the lower end of slider valve piston 36 so that springs 46 urge the member 39 downwardly. Concurrent downward movement of roller 40 allows spring metal plate 58 to engage pin 60 with an indexing hole 6 while fingers 38 are disengaged from other indexing holes 6 and pin 41 is lowered from possible engagement with pin 64, in preparation for another peeling step. At this time, the position of peeler arm 62 as in FIG. 16 also is illustrated in FIG. 12.

FLUID ACTUATION OF MOVING PARTS

Referring to FIGS. 5 and 11, slider valve piston 36 has a supply orifice 362 and upper and lower exhaust guiding slots 364 and 366. Slider valve cylinder 35 has top and bottom exhaust orifices 351 and 354, top and bottom supply orifices 356 and 358, upper and lower middle orifices 352 and 353, and an input/exhaust fitting 368 by which fluid is admitted to cylinder 35 in order to raise piston 36 against the bias of springs 46.

The base 34 of the square motion indexer 33 has upper and lower exhausts 342 and 344, a forward (extend) supply duct 346, and a reverse (retract) supply duct 348. The supporting slide 16 for the square motion indexer 33 is provided with a T-fitting 162, a supply hose 164, and a hose 166 to supply fluid to poppet valve 322. Poppet valve 322 (FIGS. 3 and 4) has an actuation button 323 and a hose 324 (FIGS. 1, 4, 6, and 7) for directing fluid to pusher pin 32 according to actuation of button 323.

As seen in FIG. 1, drive cylinder 22 has a fitting 224 by way of which fluid for retracting piston 23 is passed from a hose connected to fitting 45 which, in turn is connected to supply duct 348 of base 34 of the square motion indexing assembly. Likewise, piston 23 is extended when fluid is supplied to fitting 222 of cylinder 22 via the hose which is connected to fitting 44 which, in turn, is connected to duct 346.

In operation, constant air supplied via hose 164 to the bottom of T-fitting 162 supplies air into slide 16 and to poppet valve 322 via hose 166. Whenever button 323 is depressed, the air to poppet valve 322 is diverted to hose 324 to raise pusher pin 32 (FIG. 6). The air supplied to slide 16 is selectively applied to ducts 346 or 348 according to up and down positioning of piston 36 within cylinder 35. Piston 36 is normally biased downwardly by springs 46, as explained earlier, and is extended upwardly by fluid applied to the bottom of cylinder 35 through fitting 368. Fitting 368 is attached to a three-way valve (not shown for fluid supply to, and exhaust from, the bottom of piston 36 according to a timed actuation of the valve. When piston 36 is in the downward position of FIG. 5, air is supplied via holes 358 and 353 of cylinder 35 and hole 362 of piston 36 to duct 348 so as to retract piston rod 23 of cylinder 22 and, thus, slide member 16. At this time, slot 364 of piston 36 provides an evacuation path for exhaust of fluid from the other end of cylinder 22, through duct 346, holes 352 and 351 of cylinder 35, and exhaust port 342 of base 34.

When piston 36 is raised, fluid will be supplied to duct 346 to extend the piston of cylinder 22 and thus drive slide member 16 forward, while the fluid in duct 348 from the opposite end of cylinder 22 is exhausted through openings 353 and 354 of cylinder 35 via slot 356 in piston 36. Thus, the square motion indexer 33 is driven backward and forward by cylinder 22 according to supply of fluid to opposite ends of cylinder 22 and the fluid supply and exhaust, in turn, relies upon the raised or lowered position of piston 36.

Figure 17:
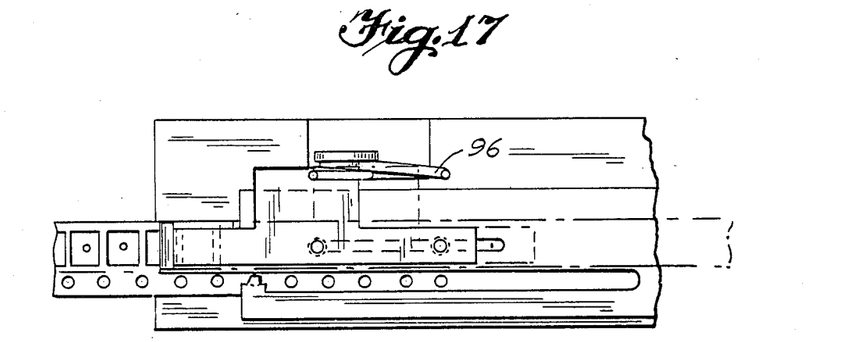
FIG. 17 is a top plan view of the device of FIG. 18.
Figure 18:
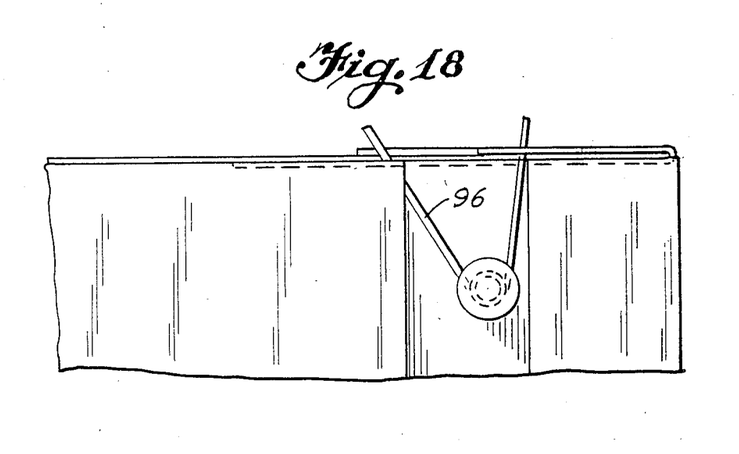
FIG. 18 is a partial elevational view illustrating an alternate embodiment of spring biasing the peeler guide to the extended position.

As seen in the alternate embodiment of FIGS. 17 and 18, it is also contemplated that a spring member 96 may be used to return a similar peeler guide to the forward, extended position upon relief of tension in cover material 8.

The following claims are intended to cover all of the generic and specific features of the invention herein described and all statements of the scope of the invention which, as a matter of language, might be said to fall therebetween.

Now that the invention has been described, we claim:

1. In an apparatus having means for feeding a component supply tape step-wise so as to present components carried by said tape to a pick-up station, said apparatus having means for changing a feeding step length so as to accommodate different center-to-center distances between said components, the improvement comprising:
 a fluid actuated reciprocating piston, the stroking length of which determines said feeding step length; and
 said step length changing means comprising a stop means for limiting said length of stroking.

2. The improvement as in claim 1, and further comprising:
 means for manually adjusting said stop means from a position which is accessible to an operator, without requiring removal of said apparatus from its use position.

3. The improvement of claim 1, and further comprising:
 means for manually changing said stop means without providing clearance between said apparatus and similar adjacent feeding apparatus.

4. The improvement of claim 1, wherein said stop means comprises:
 a physical stop member positionable to change a rearward limit of said stroking length.

5. In a tape feeder having means for feeding a tape stepwise from a supply so as to present components carried by said tape to a pick-up station for retrieval, said tape having means for retaining said components on said tape and said apparatus having peeling means for removing said retaining means from said components sequentially for said retrieval, said apparatus also having means for driving said feeding means and means for driving said peeling means, the improvement comprising:
 a base portion of said tape feeder comprising said feeding means and said means for driving said feeding means and said means for driving said peeling means;
 a subassembly of said tape feeder comprising said peeling means and a guide for said supply; and
 means for removably attaching said subassembly to said base portion.

6. The improvement as in claim 5, and further comprising:
 means for adjusting a step length of said feeding.

7. In an apparatus for feeding a tape from a supply and presenting pockets in a substrate of said tape to a pick-up station for retrieval of components from said pockets, said tape having a cover enclosing components in said pockets, said apparatus having means for feeding said substrate from a supply to said pick-up station and means for removing said cover from said pockets sequentially in order to provide access to said components at said pick-up station, said apparatus also having means for driving said feeding means and means for driving said cover removing means, the improvement comprising:
 a base to which are attached said feeding means, means for driving said feeding means, and means for driving said cover removing means;
 a subassembly to which are attached said supply, means for guiding said substrate to said pick-up station, and means for retaining said substrate in a particular location, relating to said subassembly and along a path of said feeding, between steps of said feeding; and
 means for removably attaching said subassembly to said base.

8. The improvement as in claim 7, and further comprising:
 means for adjusting a step length of said feeding.

* * * * *